(12) United States Patent
Sekine

(10) Patent No.: US 9,142,518 B2
(45) Date of Patent: Sep. 22, 2015

(54) JUNCTION AND ELECTRICAL CONNECTION

(71) Applicant: Napra Co., Ltd., Tokyo (JP)

(72) Inventor: Shigenobu Sekine, Tokyo (JP)

(73) Assignee: NAPRA CO., LTD., Tokyo (JP)

( * ) Notice: Subject to any disclaimer, the term of this patent is extended or adjusted under 35 U.S.C. 154(b) by 0 days.

(21) Appl. No.: 14/481,122

(22) Filed: Sep. 9, 2014

(65) Prior Publication Data

US 2015/0097300 A1    Apr. 9, 2015

(30) Foreign Application Priority Data

Oct. 9, 2013   (JP) .................. 2013-211899

(51) Int. Cl.
*H01L 23/48* (2006.01)
*H01L 23/00* (2006.01)
(Continued)

(52) U.S. Cl.
CPC .............. *H01L 24/05* (2013.01); *B22F 1/0003* (2013.01); *B23K 35/025* (2013.01); *H01B 1/02* (2013.01); *H01B 1/16* (2013.01); *H01B 1/22* (2013.01); *H01L 23/481* (2013.01); *H01L 23/49866* (2013.01); *H01L 24/29* (2013.01); *H01L 24/32* (2013.01); *H01L 23/49827* (2013.01); *H01L 2224/04026* (2013.01); *H01L 2224/04073* (2013.01); *H01L 2224/05647* (2013.01); *H01L 2224/1349* (2013.01); *H01L 2224/13147* (2013.01); *H01L 2224/13294* (2013.01); *H01L 2224/13311* (2013.01); *H01L 2224/13313* (2013.01); *H01L 2224/13347* (2013.01); *H01L 2224/13411* (2013.01); *H01L 2224/13447* (2013.01); *H01L 2224/2949* (2013.01); *H01L 2224/29294* (2013.01); *H01L 2224/29311* (2013.01); *H01L 2224/29313* (2013.01); *H01L 2224/29347* (2013.01); *H01L 2224/29411* (2013.01); *H01L 2224/29447* (2013.01); *H01L 2224/32507* (2013.01); *H01L 2224/81447* (2013.01); *H01L 2224/83447* (2013.01); *H01L 2225/06544* (2013.01);
(Continued)

(58) Field of Classification Search
CPC .......... H01L 2924/01047; H01L 2924/01022; H01L 2924/01049; H01L 2924/01029; H01L 2924/01013; H01L 2924/0103; H01L 2924/01083; H01L 2924/01051; H01L 2924/0105; H01L 2924/01014; H01L 24/05; H01L 23/36; H01L 23/40; H01L 23/367; H01L 23/3675; H01L 23/481; H01L 23/10; H01L 23/5225
USPC .................. 257/778–781, 786, 784, 737–738
See application file for complete search history.

(56) References Cited

U.S. PATENT DOCUMENTS

2002/0171157 A1* 11/2002 Soga et al. .................... 257/783
2014/0117533 A1*  5/2014 Lei et al. ....................... 257/737

FOREIGN PATENT DOCUMENTS

| JP | 2002-261105 A | 9/2002 |
|---|---|---|
| JP | 3869859 B2 | 1/2007 |
| WO | 98/39781 A1 | 9/1998 |

*Primary Examiner* — Hoa B Trinh
(74) *Attorney, Agent, or Firm* — Westerman, Hattori, Daniels & Adrian, LLP

(57) ABSTRACT

A junction at which at least two conductors are connected together includes a compound region containing Cu, Sn and at least one element selected from the group consisting of Si, B, Ti, Al, Ag, Bi, In, Sb, Ga and Zn. The compound region forms a nanocomposite metal diffusion region with the conductor.

9 Claims, 4 Drawing Sheets

(51) Int. Cl.
  *B22F 1/00* (2006.01)
  *B23K 35/02* (2006.01)
  *H01B 1/02* (2006.01)
  *H01B 1/16* (2006.01)
  *H01B 1/22* (2006.01)
  *H01L 23/498* (2006.01)
(52) U.S. Cl.
  CPC .................. *H01L 2924/0103* (2013.01); *H01L 2924/01005* (2013.01); *H01L 2924/0105* (2013.01); *H01L 2924/01013* (2013.01); *H01L 2924/01014* (2013.01); *H01L 2924/01022* (2013.01); *H01L 2924/01029* (2013.01); *H01L 2924/01031* (2013.01); *H01L 2924/01047* (2013.01); *H01L 2924/01049* (2013.01); *H01L 2924/01051* (2013.01); *H01L 2924/01083* (2013.01); *H01L 2924/13091* (2013.01); *H01L 2924/3656* (2013.01)

JUNCTION AND ELECTRICAL CONNECTION

BACKGROUND OF THE INVENTION

1. Field of the Invention

The present invention relates to a junction and electrical connection.

2. Description of the Related Art

As a means for realizing a three-dimensional circuit configuration in electronic devices such as various scales of integrated circuits, various types of semiconductor elements or chips thereof, there has been proposed a TSV (through-silicon-via) technology of providing a circuit substrate with a large number of through conductors and stacking and bonding such circuit substrates. By applying the TSV technology to the three-dimensional circuit configuration, many functions can be packed into a small footprint. Moreover, important electrical pathways between elements can be dramatically shortened to increase processing speed. Japanese Patent No. 3869859 discloses a via hole structure essential for the TSV technology.

The via hole structure disclosed in Japanese Patent No. 3869859 must contain a binder and/or a reactive monomer or polymer in addition to a high melting point metal, a low melting point metal or metal alloy and a crosslinking agent. In a cured state within a via hole, a polymeric network generated by crosslinking of organic constituents of a conductive adhesive coexists with an alloyed metal network.

After the via hole structure disclosed in Japanese Patent No. 3869859 is cured within the via hole, the polymeric network coexists with the alloyed metal network, as described in its specification. This degrades electrical conductivity accordingly.

Also, there is a problem inherent in diffusion bonding of metal, i.e., the formation of voids, cracks or the like due to Kirkendall voids. Kirkendall voids arise as atomic vacancies (lattice), which arise from the asymmetry of interdiffusion, accumulate without disappearing. In the case of a Sn/Cu interface, for example, since Sn diffuses less than Cu, the vacancies accumulate at the interface between the intermetallic compound and Cu, thereby forming Kirkendall voids. Such Kirkendall voids may grow into a larger void or crack, deteriorating the reliability or quality of conductors and therefore causing disconnection. Japanese Patent No. 3869859 does not disclose any countermeasure against this problem.

On the other hand, Japanese Unexamined Patent Application Publication No. 2002-261105 discloses a technology of connecting an electrode of a semiconductor device with an electrode of a mounting substrate through a junction comprising a CuSn compound including $Cu_6Sn_5$ and Cu balls and also connecting the Cu balls together through the CuSn compound. However, since the electrodes and the Cu balls are connected together by the CuSn compound, Kirkendall voids may arise at the Sn/Cu interface.

A similar problem arises in forming an electrical connection with a through conductor or a planar conductor pattern on a wafer or in forming a junction at which semiconductor chips are connected to each other in an electronic device, e.g., in the form of three-dimensional system-in-package (3D-SiP).

SUMMARY OF THE INVENTION

It is an object of the present invention to provide a junction and electrical connection free from voids or cracks.

It is another object of the present invention to provide a junction and electrical connection that melts at a low temperature but the melting point of which becomes higher after solidification.

In order to attain at least one of the above objects, the present invention provides a junction at which at least two conductors are connected together comprising a compound region containing Cu, Sn and at least one element selected from the group consisting of Si, B, Ti, Al, Ag, Bi, In, Sb, Ga and Zn, the compound region forming a nanocomposite metal diffusion region with the conductor.

In the junction according to the present invention, since the compound region containing Cu, Sn and at least one element selected from the group consisting of Si, B, Ti, Al, Ag, Bi, In, Sb, Ga and Zn forms a nanocomposite metal diffusion region with the conductor, as described above, the asymmetry of interdiffusion between the compound and the conductor can be mitigated by selection of metal components to be contained in the compound region and, if necessary, by changing the melting temperature in steps. As a result, the accumulation of atomic vacancies (lattice) can be avoided to suppress the formation of Kirkendall voids. Thus, a junction free from Kirkendall voids or the like can be formed.

Moreover, the compound region containing the above components can form a junction that melts at a low temperature but the melting point of which becomes higher after solidification depending on the selection and combination of the metal components. Therefore, high temperature strength can be ensured by elastic bonding force due to binding between high melting point compounds, while longevity can be assured during thermal cycle by softness of a soft metal component such as Sn.

The present invention is also applicable to an electrical connection supported by a substrate. The electrical connection comprises a Cu or Cu alloy region and a compound region containing Cu, Sn and at least one element selected from the group consisting of Si, B, Ti, Al, Ag, Bi, In, Sb, Ga and Zn, the compound region forming a nanocomposite metal diffusion region with the Cu or Cu alloy region.

The electrical connection according to the present invention has the same effects as described above in respect of the junction. It should be noted that the electrical connection may be an electrical connection having a through conductor or an electrical connection having a planar conductor pattern.

The junction and electrical connection according to the present invention may contain at least two kinds of components selected from first, second and third metal components. In this case, it may contain all the three kinds of components or only two kinds of components among the first, second and third metal components. For example, it may contain the first and second metal components, the first and third metal components, or the second and third metal components. The combination may be determined in view of the type and relative amount of components in the first, second and third metal components.

Specifically, the first metal component may contain Cu and at least one element selected from the group consisting of Si, B, Ti, Al, Ag and Zn. The second metal component may contain Sn, Cu and at least one element selected from the group consisting of Si, B, Ti, Al, Ag and Zn. The third metal component may contain Sn, Bi, Ga and at least one element selected from the group consisting of Si, B, Ti, Al, Ag and Zn. Alternatively, the third metal component may contain Sn, Bi, In, Sb and at least one element selected from the group consisting of Ga, Si, B, Ti, Al, Ag and Zn.

According to the present invention, as understood from above, the following advantages can be obtained.

(a) It is possible to provide a junction and electrical connection that can suppress the formation of Kirkendall voids.
(b) It is possible to provide a junction and electrical connection that melts at a low temperature but the melting point of which becomes higher after solidification.

The present invention will be more fully understood from the detailed description given hereinbelow and the accompanying drawings which are given by way of illustration only, and thus not to be considered as limiting the present invention.

DESCRIPTION OF THE PREFERRED EMBODIMENTS

Figure 1:
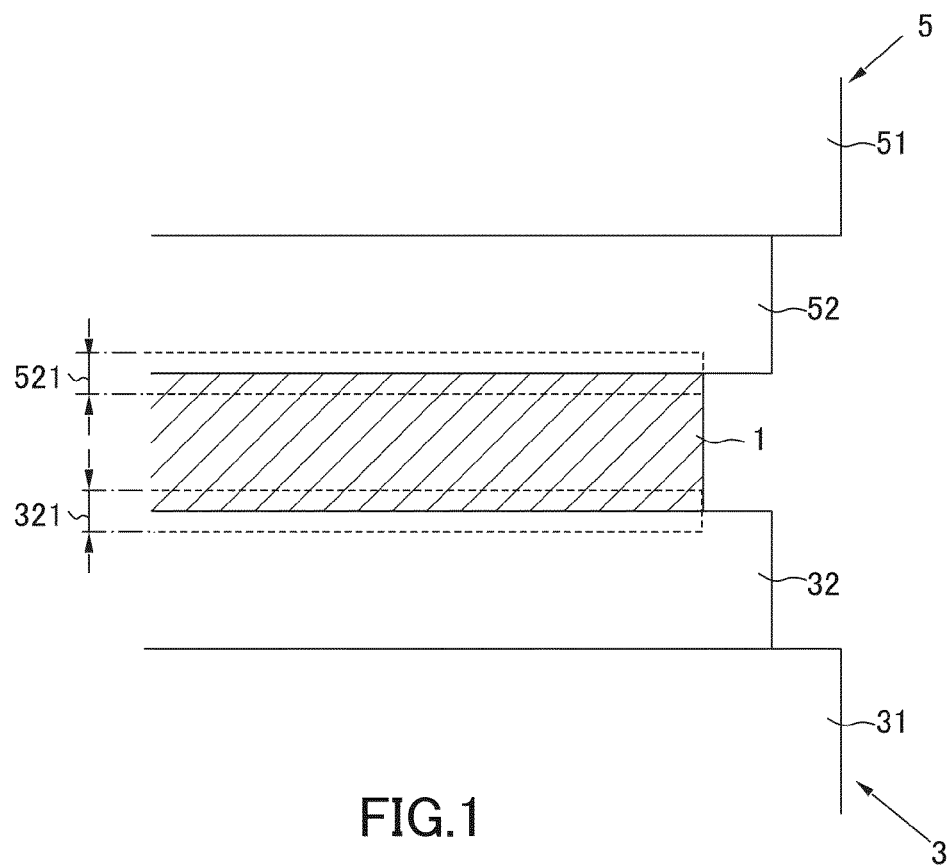
FIG. 1 is a drawing showing an electronic device employing a junction according to the present invention.

Referring to FIG. 1, a junction 1 is located between a conductor 32 on a substrate 31 of an electronic device 3 and a conductor 52 on a substrate 51 of an electronic device 5, connecting the conductors 32 and 52. The conductors 32 and 52 may be a so-called electrode, bump or terminal electrode. The conductors 32 and 52 may have a known composition and structure. For example, they can be formed as a single layer film or multi-layer film containing Cu, Al, Ni, Sn, Ag, Au, Pt, Pd, etc.

The junction 1 has a compound region containing Cu, Sn and at least one element selected from the group consisting of Si, B, Ti, Al, Ag, Bi, In, Sb, Ga and Zn. The compound region forms nanocomposite metal diffusion regions 321, 521 with the conductors 32, 52. The nanocomposite refers to a structure in which crystals or amorphous bodies of metal/alloy or compounds thereof are integrated and combined in nanometer order. As compared with the related art (e.g., Japanese Unexamined Patent Application Publication No. 2002-261105), the compound region is characterized by containing at least one element selected from the group consisting of Si, B, Ti, Al, Ag, Bi, In, Sb, Ga and Zn, in addition to Cu and Sn.

The junction 1 may also have a nanocomposite metal diffusion region within.

In the foregoing junction, the asymmetry of interdiffusion can be mitigated at the metal diffusion regions 321, 521 between the compound region and the conductors 32, 52, so that the accumulation of atomic vacancies (lattice) can be avoided to suppress the formation of Kirkendall voids. Thus, an interconductor junction free from Kirkendall voids or the like can be formed.

Moreover, the compound region containing the above components can form a junction that melts at a low temperature but the melting point of which becomes higher after solidification depending on the selection and combination of the metal components. When the conductor is a typical Cu conductor, for example, the compound region reacts with the Cu conductor to form a nanocomposite intermetallic compound. The intermetallic compound has a high melting point, ensuring a sufficient strength at a soldering temperature of 250° C. Therefore, the junction between the electronic devices serves as a composite that ensures high temperature strength in a secondary reflow process by elastic bonding force due to binding between high melting point compounds and also assures longevity during thermal cycle by softness of a soft metal component, so that it can be effectively used for temperature hierarchical connection at a high temperature.

As described above, the junction according to the present invention may also have a nanocomposite metal diffusion region within. Also in this case, the asymmetry of interdiffusion can be mitigated by selection of metal components to be contained in the compound region and, if necessary, by changing the melting temperature in steps. As a result, the accumulation of atomic vacancies (lattice) can be avoided to suppress the formation of Kirkendall voids. Thus, a junction free from Kirkendall voids or the like can be formed.

Figure 2:
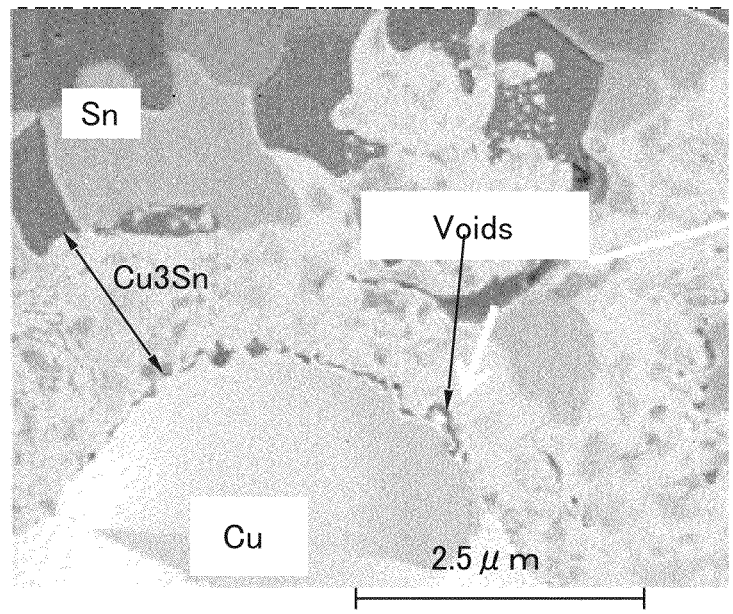
FIG. 2 is an SEM image of an electrical connection made of a conventional Sn—Cu conductive paste.

In this regard, description will be made with reference to SEM (scanning electron microscope) images shown in FIGS. 2 and 3. FIG. 2 shows the SEM image of an electrical connection made of a conventional Sn—Cu conductive paste, while FIG. 3 shows the SEM image of a junction having a composition according to the present invention.

Referring first to FIG. 2 showing the SEM image of the electrical connection made of the conventional Sn—Cu conductive paste, the diffusion layer of $Cu_3Sn$ exists at the interface between the Cu crystal and the Sn crystal, and the voids are formed almost all along the interface between the $Cu_3Sn$ layer and the Cu crystal.

Figure 3:
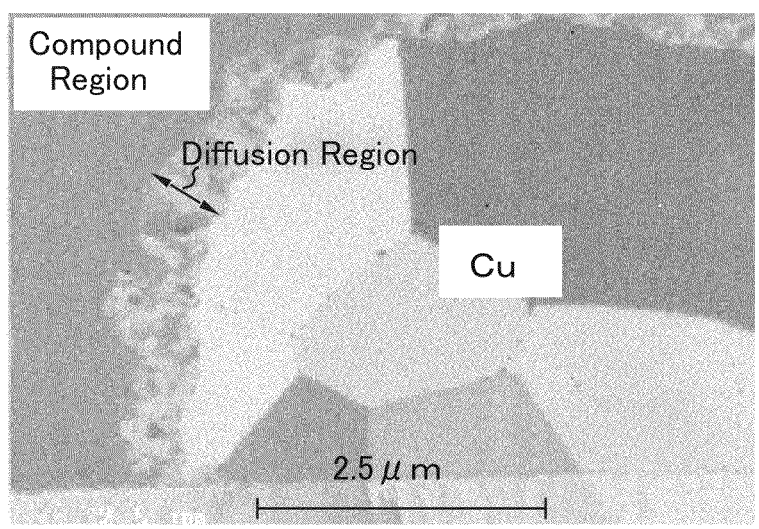
FIG. 3 is an SEM image of a junction having a composition according to the present invention.

Referring to FIG. 3, on the other hand, the diffusion layer formed at the interface between the Cu crystal and the compound region in the junction according to the present invention has a shape in conformity with the shape of the Cu crystal and the compound region, joining to the Cu crystal and the compound region without having voids therebetween. The diffusion region constitutes a nanocomposite structure having a layer thickness of 700 nm or less.

It should be noted that in FIG. 3, the difference in image color within the Cu crystal region comes from the difference in crystal orientation. Moreover, although FIG. 3 shows the structure within the junction, the same diffusion bonding structure as shown in FIG. 3 can be seen at the diffusion regions 321, 521 formed between the junction 1 and the conductors 32, 52.

The junction described with reference to FIGS. 1 to 3 may contain at least two kinds of components selected from first, second and third metal components. In this case, it may contain all the three kinds of components or only two kinds of components among the first, second and third metal components. For example, it may contain the first and second metal components, the first and third metal components, or the second and third metal components. The combination may be determined in view of the type and relative amount of components in the first, second and third metal components.

Specifically, the first metal component may contain Cu and at least one element selected from the group consisting of Si, B, Ti, Al, Ag and Zn. The second metal component may contain Sn, Cu and at least one element selected from the group consisting of Si, B, Ti, Al, Ag and Zn. The third metal component may contain Sn, Bi, Ga and at least one element selected from the group consisting of Si, B, Ti, Al, Ag and Zn. Alternatively, the third metal component may contain Sn, Bi, In, Sb and at least one element selected from the group consisting of Ga, Si, B, Ti, Al, Ag and Zn.

The first, second and third metal components each contain two or more kinds of metal components. Preferably, the melting point T1(° C.) of the first metal component, the melting point T2(° C.) of the second metal component and the melting point T3(° C.) of the third metal component satisfy a relationship of T1>T2>T3. This further mitigates the asymmetry of interdiffusion. Specific examples are as follows.

1. First Metal Component

Specifically, the first metal component may contain Cu and at least one element selected from the group consisting of Si, B, Ti, Al, Ag and Zn. The composition ratio of the components may be set within the following range.

Cu: 99.9 wt % or less
Sn: 50 wt % or less
Si, B, Ti, Al, Ag and Zn: 0.01 wt % or less Particles of Cu or an alloy thereof are preferably coated with an oxidation-inhibiting film. A suitable oxidation-inhibiting film is a plating formed by plating the particles of Cu or an alloy thereof with Ag or Sn. Alternatively, they may be coated with a resin that sublimes at 150° C. or more.

2. Second Metal Component

Specifically, the second metal component may contain Sn, Cu and at least one element selected from the group consisting of Si, B, Ti, Al, Ag and Zn. The composition ratio of the components may be set within the following range.

Sn: 98 wt % or less
Cu: 30 wt % or less
Si, B, Ti, Al, Ag and Zn: 0.01 wt % or less 3. Third Metal Component (1) As one option, the third metal component may contain Sn, Bi, Ga and at least one element selected from the group consisting of Si, B, Ti, Al, Ag and Zn. In this case, the composition ratio of the components may be set within the following range.

Sn: 40 to 80 wt %
Bi: 15 to 60 wt %
Ga: 0.1 wt % or less
Al: 1 wt % or less
Si, B, Ti, Ag and Zn: 0.01 wt % or less (2) As another option, the third metal component may contain Sn, Bi, In, Sb and at least one element selected from the group consisting of Ga, Si, B, Ti, Al, Ag and Zn. In this case, the composition ratio of the components may be set within the following range.

In: 20 wt % or less with respect to Sn
Bi: 20 wt % or less with respect to Sn
Sb: 20 wt % or less with respect to Sn
Ga, Si, B, Ti, Al, Ag and Zn: 1 wt % or less In the above cases, the melting points T1, T2 and T3 are as follows.

T1=1100° C. to 500° C.
T2=400° C. to 250° C.
T3=250° C. or less

The junction contains at least two kinds of components selected from the first to third metal components; it is not required to contain all the three kinds of components. For example, it may a combination of the first metal component having Cu as a main component and the second metal component having Sn as a main component or a combination of the first metal component and the third metal component having Sn as a main component.

The first metal component, the second metal component and the third metal component may be dispersed in a fluid dispersion medium. As the fluid dispersion medium, there may be used various types of organic binders, aqueous dispersion mediums or volatile organic dispersion mediums. Since various types of such dispersion mediums have been known in the art, the most suitable one should be chosen. Specifically, they may be used as a fluid functional material such as a conductive paste for an electrical connection, a paste for filling, a paste for a conductor, a paste for sealing or a paste for bonding.

The present invention is also applicable to an electrical connection supported by a substrate. In this regard, description will be made with reference to FIGS. 4 and 5. Referring first to the electrical connection shown in FIG. 4, a through conductor 72 is provided in a hole or groove extending in a substrate 71 along the thickness direction.

The substrate 71 may be a semiconductor substrate such as Si substrate, SiC substrate or SOI substrate. Also, it may be an inorganic or organic insulating substrate, a dielectric substrate, a magnetic substrate or a composite substrate thereof.

The through conductor 72 is embedded in a vertical hole passing through the substrate 71 in the thickness direction. For example, the through conductor 72 may have a diameter of, but not limited to, 60 μm or less. The diameter may further be reduced to 10 μm or less.

When the substrate 71 is a semiconductor substrate such as Si substrate, the through conductor 72 is circumferentially covered with an organic or inorganic insulating layer 73. The through conductor 71 has terminal conductors 74, 75 at opposite ends thereof. Furthermore, insulating layers 76, 77 are formed on opposite surfaces of the substrate 71 in the thickness direction. The insulating layers 76, 77 may be a single layer of $SiO_2$ or SiN or a stack of a $SiO_2$ layer and an overlying SiN layer. The insulating layers 76, 77 serve not only as an original electrical insulating layer but also as a layer that inhibits warping of the substrate.

The through conductor 72, which serves as an electrical connection, and the terminal conductors 74, 75 contain Cu, Sn and at least one element selected from the group consisting of Si, B, Ti, Al, Ag, Bi, In, Sb, Ga and Zn, having a nanocomposite metal diffusion region within, as shown in FIG. 3.

The insulating layer 73 may be an oxide or nitride film formed by modifying the inner wall surface of the vertical hole or an insulating layer made of an inorganic functional material, an organic functional material or a combination thereof filled into the vertical hole. When the insulating layer 73 is an inorganic insulating layer, specifically, it may be formed such that an insulating paste containing insulating particles, Si particles and an organic Si compound is filled into the vertical holes and hardened. In the process of forming the insulating layer 73, the organic Si compound is reacted with the Si particles inside the vertical holes to form Si—O bond network filling up the space around the insulating particles. Preferably, the reaction between the organic Si compound and the Si particles is allowed to proceed under vacuum while being heated, for example, within a temperature range of 130° C. to 150° C.

Figure 5:
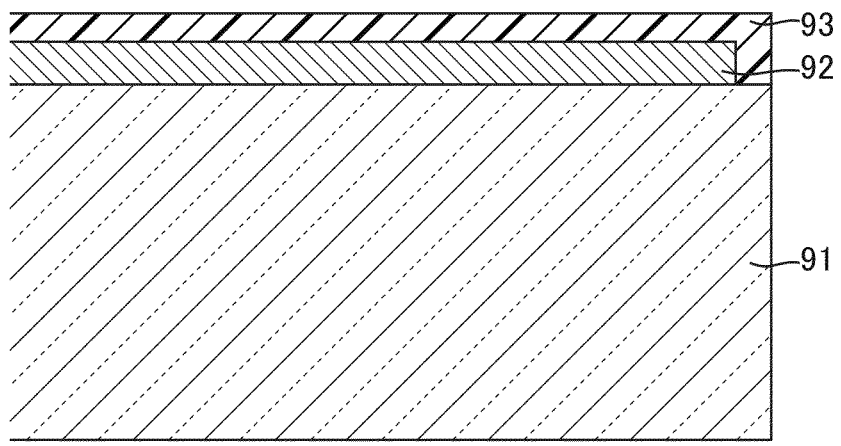
FIG. 5 is a drawing showing still another electronic device according to the present invention.

On the other hand, FIG. 5 shows an electronic device in which a planar electrical connection 92 in a given pattern is formed on one surface of a substrate 91. The electrical connection 92 is a metallization trace containing Cu, Sn and at least one element selected from the group consisting of Si, B, Ti, Al, Ag, Bi, In, Sb, Ga and Zn, having a nanocomposite metal diffusion region within (see FIG. 3). If necessary, the electrical connection 92 may be covered with a protective film 93 that is a synthetic resin film. The protective film 93 may be an insulating film or may be poor in insulation.

Figure 4:
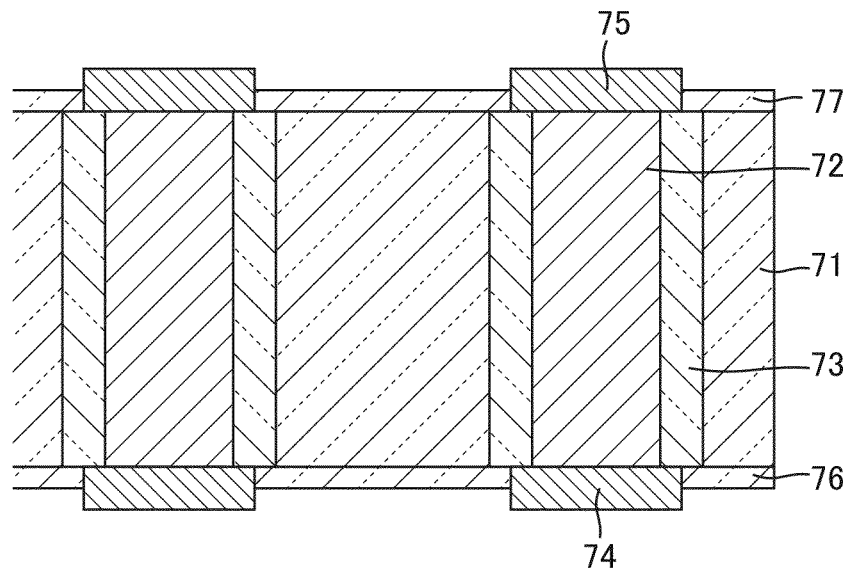
FIG. 4 is a drawing showing another electronic device according to the present invention.
Figure 6:
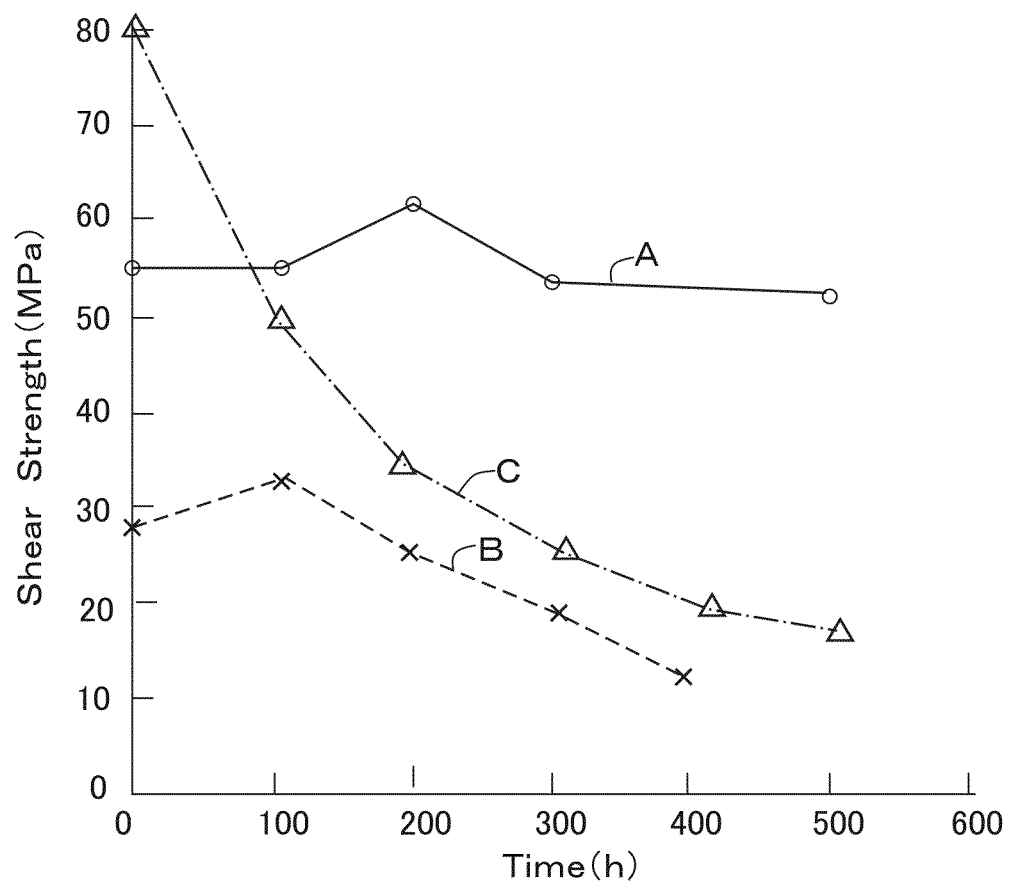
FIG. 6 is a drawing showing the results of high temperature shear strength test at 300° C.

The electrical connections shown in FIGS. 4 and 5 have the same structure and effect as the junction described with reference to FIGS. 1 to 3 and also exhibit a high retention reliability at high temperature when tested for high temperature shear strength. In this regard, description will be made with reference to FIG. 6. FIG. 6 is a drawing showing the results of high temperature shear strength test at 300° C., wherein time (h) is plotted in abscissa and shear strength (MPa) is plotted in ordinate. The curve A represents the shear strength characteristic of an electrical connection (FIG. 5) according to the present invention; the curve B represents the shear strength characteristic of an electrical connection made of a conductive paste disclosed in Japanese Patent No.

3869859; the curve C represents the shear strength characteristic of a conventional electrical connection made of an Au-12Ge conductive paste.

At first, as indicated by the curve B, the shear strength of the electrical connection made of the conductive paste disclosed in Japanese Patent No. 3869859 is as low as 30 (MPa) at the beginning and drops to 10 (MPa) at 400 hours.

Then, as indicated by the curve C, the shear strength of the conventional electrical connection made of the Au-12Ge conductive paste is as high as 80 (MPa) at the beginning but rapidly decreases over time and drops to about 20 (MPa) at 500 hours.

On the other hand, as indicated by the curve A, the shear strength of the electrical connection according to the present invention is as high as 57 (MPa) at the beginning and remains about the same at 500 hours.

From the above, it is understood that since the electrical connection according to the present invention becomes a continuous layer free from voids, cracks and disconnection, the density and compactness can be increased. Therefore, the electrical connection can be provided with a high electrical conductivity and high mechanical and physical strength. When made of the same material, the experimental data in FIG. 6 is also applicable to the junction of FIG. 1 and the electrical connection of FIG. 4.

Typically, the electronic device to which the present invention is applicable is an interposer. It may also be a system LSI, a memory LSI, an image sensor, a MEMS, an electronic device including an analog or digital circuit, a logic circuit such as CPU or the like, or an electronic device that is produced by preparing different types of circuits such as an analog high frequency circuit and a low frequency, low power consumption circuit in different processes and stacking them. Furthermore, it may be selected from most of electronic devices having an electronic circuit as a functional element, such as a sensor module, an optoelectronic module, a unipolar transistor, a MOS FET, a CMOS FET, a memory cell, integrated circuits (IC) thereof, or various scales of LSIs.

While the present invention has been particularly shown and described with respect to preferred embodiments thereof, it will be understood by those skilled in the art that various changes in form and detail may be made therein without departing from the spirit, scope and teaching of the invention.

What is claimed is:

1. A junction at which at least two conductors are connected together comprising a compound region, wherein the compound region comprising:
at least one selected from the group consisting of a first metal component and a second metal component; and
a third metal component,
wherein the first metal component containing Cu and at least one element selected from the group consisting of Si, B, Ti, Al, Ag and Zn,
wherein the second metal component containing Sn, Cu and at least one element selected from the group consisting of Si, B, Ti, Al, Ag and Zn,
wherein the third metal component containing:
(a) Sn, Bi, Ga and at least one element selected from the group consisting of Si, B, Ti, Al, Ag and Zn; or
(b) Sn, Bi, In, Sb and at least one element selected from the group consisting of Ga, Si, B, Ti, Al, Ag and Zn.

2. An electrical connection supported by a substrate, comprising the junction of claim 1.

3. The junction according to claim 1, wherein the compound region comprises the first metal component, the second metal component, and the third metal component.

4. The junction according to claim 1, wherein the first metal component, the second metal component, and the third metal component satisfy a relationship of T1>T2>T3, wherein T1 is a melting point (° C.) of the first metal component, T2 is a melting point (° C.) of the second metal component, T3 is a melting point (° C.) of the third metal component.

5. The junction according to claim 3, wherein the first metal component, the second metal component, and the third metal component satisfy a relationship of T1>T2>T3, wherein T1 is a melting point (° C.) of the first metal component, T2 is a melting point (° C.) of the second metal component, T3 is a melting point (° C.) of the third metal component.

6. The junction according to claim 1, wherein the first metal component comprises Cu as a major component, and the second metal component comprises Sn as a major component.

7. The junction according to claim 3, wherein the first metal component comprises Cu as a major component, and the second metal component comprises Sn as a major component.

8. The junction according to claim 1, wherein the third metal component contains (a) Sn, Bi, Ga and at least one element selected from the group consisting of Si, B, Ti, Al, Ag and Zn.

9. The junction according to claim 1, wherein the third metal component contains (b) Sn, Bi, In, Sb and at least one element selected from the group consisting of Ga, Si, B, Ti, Al, Ag and Zn.

* * * * *